United States Patent
Yeh et al.

(10) Patent No.: US 7,985,636 B2
(45) Date of Patent: Jul. 26, 2011

(54) METHOD FOR FABRICATING LOW TEMPERATURE POLY-SILICON THIN FILM TRANSISTOR SUBSTRATE

(75) Inventors: Guan-Hua Yeh, Miao-Li (TW); Tsai-Lai Cheng, Miao-Li (TW); Hong-Gi Wu, Miao-Li (TW)

(73) Assignee: Chimel Innolux Corporation, Miao-Li County (TW)

( * ) Notice: Subject to any disclaimer, the term of this patent is extended or adjusted under 35 U.S.C. 154(b) by 0 days.

(21) Appl. No.: 12/583,461

(22) Filed: Aug. 21, 2009

(65) Prior Publication Data

US 2010/0047975 A1 Feb. 25, 2010

(30) Foreign Application Priority Data

Aug. 22, 2008 (CN) .......................... 2008 1 0142026

(51) Int. Cl.
*H01L 21/336* (2006.01)
(52) U.S. Cl. ............... 438/166; 438/210; 257/E21.413
(58) Field of Classification Search .......... 438/141–166, 438/197, 200, 210
See application file for complete search history.

(56) References Cited

U.S. PATENT DOCUMENTS

| | | | |
|---|---|---|---|
| 6,251,712 B1* | 6/2001 | Tanaka et al. ................. | 438/143 |
| 6,924,874 B2* | 8/2005 | Lin et al. ....................... | 349/187 |
| 7,192,815 B2* | 3/2007 | Shen .............................. | 438/164 |
| 7,498,210 B2* | 3/2009 | Cheng ........................... | 438/155 |
| 7,638,373 B2* | 12/2009 | Heo et al. ..................... | 438/149 |
| 7,670,883 B2* | 3/2010 | Shih et al. .................... | 438/149 |
| 7,674,658 B2* | 3/2010 | Li et al. ........................ | 438/149 |
| 2004/0197967 A1* | 10/2004 | Chen ............................. | 438/154 |
| 2006/0199316 A1 | 9/2006 | Kuo | |
| 2007/0296883 A1* | 12/2007 | Kwon et al. .................. | 349/43 |
| 2008/0251791 A1* | 10/2008 | Yeh et al. ..................... | 257/71 |
| 2009/0189204 A1* | 7/2009 | Heitzinger et al. ........... | 257/288 |
| 2009/0206737 A1* | 8/2009 | Liu et al. ...................... | 313/504 |

FOREIGN PATENT DOCUMENTS

CN 1530716 A 9/2004

* cited by examiner

*Primary Examiner* — Savitri Mulpuri
(74) *Attorney, Agent, or Firm* — Wei Te Chung

(57) ABSTRACT

An exemplary method for fabricating an LTPS-TFT substrate is as follows. In step S1, a p-Si pattern including a source electrode contact region and a drain electrode contact region of a first type TFT, a source electrode contact region and a drain electrode contact region of a second type TFT is formed. In step S2, the source electrode contact region and the drain electrode contact region of the first type TFT are heavily doped with a first dopant. In step S3, gate electrodes of the first and the second type TFT are formed. In step S4, the source electrode contact regions and drain electrode contact regions of the first and second type TFTs are heavily doped with a second dopant. The first dopant and the second dopant are compensative, and the number ratio of the first dopant to the second dopant is approximately 2 to 1.

16 Claims, 3 Drawing Sheets

US 7,985,636 B2

METHOD FOR FABRICATING LOW TEMPERATURE POLY-SILICON THIN FILM TRANSISTOR SUBSTRATE

BACKGROUND

1. Technical Field

The present disclosure relates to substrate fabrication, and particularly to a method for fabricating an LTPS-TFT substrate.

2. Description of Related Art

A low temperature poly-silicon (p-Si) thin film transistor (LTPS-TFT) can be used in a peripheral driving circuit on a glass substrate, as well as in a pixel control switch in an active matrix liquid crystal display (AMLCD). An LTPS-TFT has many advantages such as high driving current, high carrier mobility, small sub-threshold swing, and low leakage current.

However, a commonly used method for fabricating an LTPS-TFT substrate requires nine photo-masks—a complicated process. As a result, the quality of the LTPS-TFT substrate is not guaranteed, and the cost of the method is high.

What is needed, therefore, is a method for fabricating an LTPS-TFT substrate which can overcome the described limitations.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the described embodiments. In the drawings, like reference numerals designate corresponding parts throughout various diagrams.

DETAILED DESCRIPTION

Figure 1:
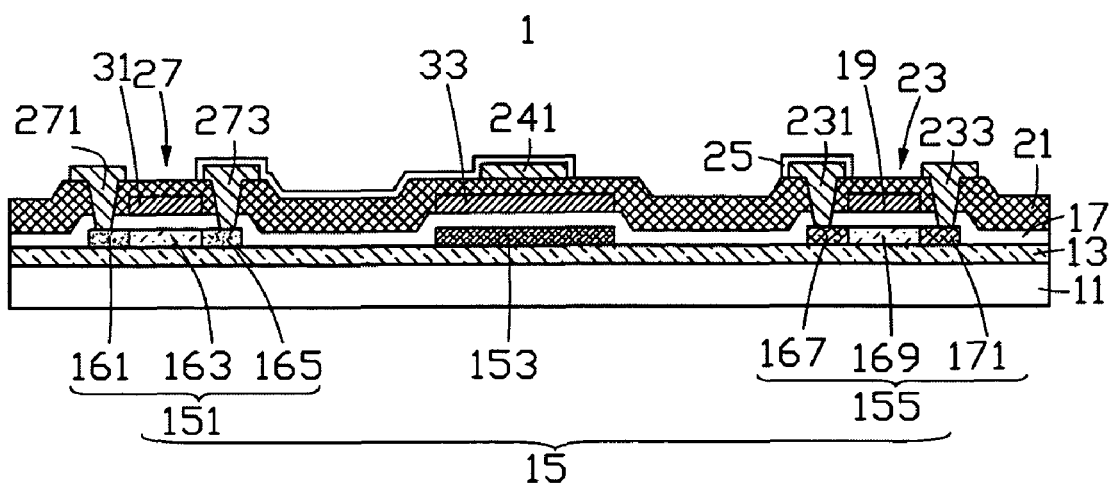
FIG. 1 is a cross-section of a part of an LTPS-TFT substrate fabricated according to the method of the present disclosure.

Referring to FIG. 1, an LTPS-TFT substrate 1 fabricated according to the method of the present disclosure includes an n-type TFT 27, a p-type TFT 23, and a storage capacitor (not labeled) formed between the n-type TFT 27 and the p-type TFT 23. In detail, the LTPS-TFT substrate 1 includes a substrate 11, a buffer layer 13, a p-Si pattern 15, a gate insulator 17, three metal wires 19, 31, 33 arranged at intervals with respect to one another, a passivation layer 21, five electrodes 271, 273, 241, 231, 233, and a pixel electrode 25. Via contact holes (not labeled) defined in the passivation layer 21 and the gate insulator 17, and the electrodes 271, 273, 231, 233, correspond to the p-Si pattern 15.

The p-Si pattern 15 includes an n-type TFT contact region 151, a storage capacitor contact region 153, and a p-type TFT contact region 155. The n-type TFT contact region 151 includes a source electrode contact region 161, a channel 163, and a drain electrode contact region 165. The p-type TFT contact region 155 includes a source electrode contact region 167, a channel 169, and a drain electrode contact region 171.

The metal wires 19, 31 formed at two ends of the LTPS-TFT substrate 1 are used as gate electrodes of the n-type TFT 27 and the p-type TFT 23, respectively, and the other metal wire 33 formed in the middle of the LTPS-TFT substrate 1 is used as a first electrode of the storage capacitor. The electrode 241 is used as a second electrode of the storage capacitor. The electrode 271 connected to the source electrode contact region 161 is used as a source electrode of the n-type TFT 27, and the electrode 273 connected to the drain electrode contact region 165 is used as a drain electrode of the n-type TFT 27. The electrode 231 connected to the source electrode contact region 167 is used as a source electrode of the p-type TFT 23, and the electrode 233 connected to the drain electrode contact region 171 is used as a drain electrode of the p-type TFT 23.

Figure 2:
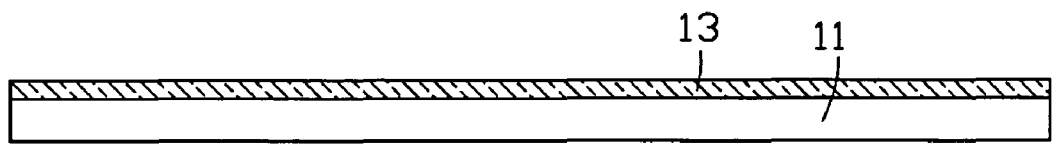
FIGS. 2 to 11 are cross-sections showing sequential stages of the method of the present disclosure.
Figure 3:
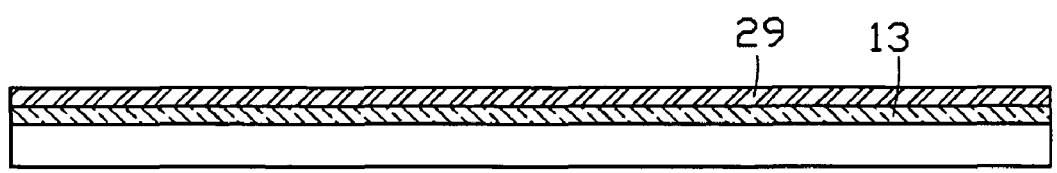

Referring to FIGS. 2-11, an exemplary method for fabricating an LTPS-TFT substrate 1 is as follows. In step S1, a substrate 11 is provided, and a buffer layer 13 and a p-Si layer (not labeled) are formed in that sequence on the substrate 11. In step S2, a p-Si pattern 15 including an n-type TFT contact region 151, a storage capacitor contact region 153 and a p-type TFT contact region 155 is formed. In step S3, the storage capacitor contact region 153 and two ends of the p-type TFT contact region 155 are heavily doped with a first dopant. In step S4, a gate insulator 17 is formed on the p-Si pattern 15 and the buffer layer 13. In step S5, three metal wires 31, 33, 19 are formed. This is followed by formation of a source electrode contact region 161, a channel 163 and a drain electrode contact region 165 all of the n-type TFT contact region 151, and formation of a source electrode contact region 167, a channel 169 and a drain electrode contact region 171 all of the p-type TFT contact region 155, with all such formation achieved by doping two ends of the p-type TFT contact region 155 and doping two ends of the n-type TFT contact region 151. In step S6, a passivation layer 21 is formed covering the gate insulator 17 and the three metal wires 31, 33, 19, and then four contact holes (not labeled) corresponding to the p-Si pattern 15 are formed. In step S7, five electrodes 271, 273, 241, 231, 233 are formed. In step S8, a pixel electrode 25 is formed. A detailed description of the exemplary method for fabricating the LTPS-TFT substrate 1 is as follows:

In step S1, referring to FIG. 2 and FIG. 3, the substrate 11 is provided. The substrate 11 may be made of glass or quartz. The buffer layer 13 is formed on the substrate 11 by chemical vapor deposition (CVD) or physical vapor deposition (PVD). The buffer layer 13 is made of silicon nitride or silicon oxide. An a-Si layer 29 is formed on the buffer layer 13 by CVD (as shown in FIG. 3). During excimer laser annealing (ELA), the a-Si layer 29 is melted and then crystallizes into the p-Si layer.

Figure 4:
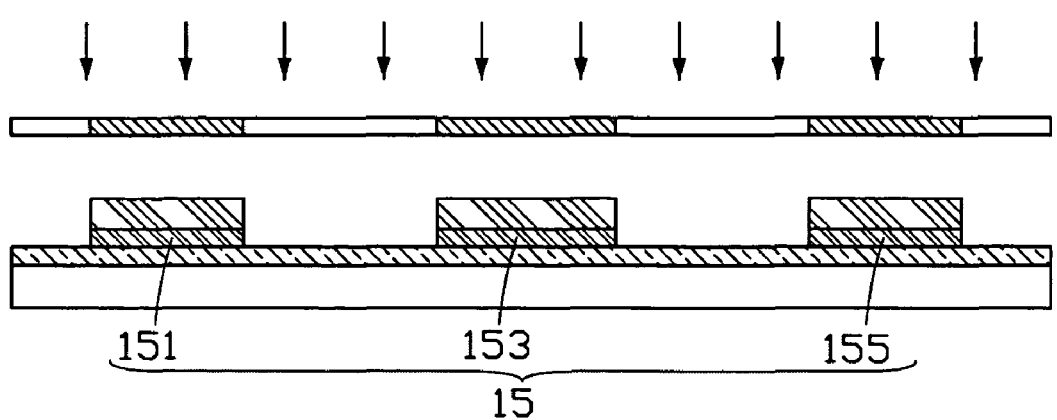

In step S2, referring to FIG. 4, a first photo-resist layer (not labeled) is formed on the p-Si layer. A first photo-mask (not labeled) and ultraviolet radiation are provided to expose the first photo-resist layer. The exposed first photo-resist layer is then developed, thereby forming a first photo-resist pattern. Using the first photo-resist pattern as a mask, the p-Si layer is etched, thereby forming the p-Si pattern 15. The p-Si pattern 15 includes the n-type TFT contact region 151, the storage capacitor contact region 153, and the p-type TFT contact region 155. The first photo-resist layer is half-tone photo-resist, exposed though absorbing light energy of the UV radiation.

Figure 5:
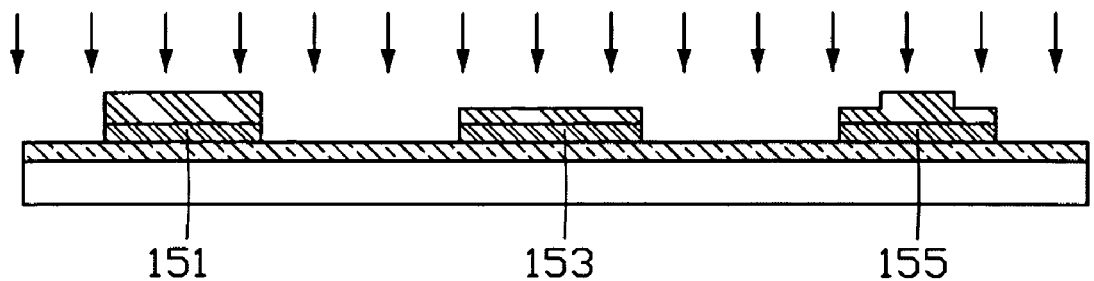
Figure 6:
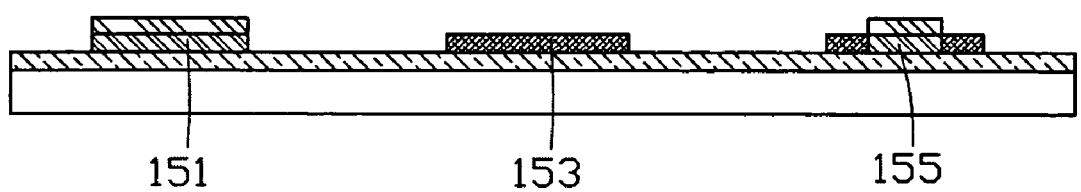

In step S3, referring to FIG. 5 and FIG. 6, a second photo-mask (not shown) and ultraviolet radiation are provided to expose the first photo-resist pattern remaining from step S2. The exposed first photo-resist pattern is then developed, thereby forming a second photo-resist pattern (not labeled) on the n-type TFT contact region 151, the storage capacitor contact region 153, and the p-type TFT contact region 155. The second photo-resist pattern has the following configurations. The second photo-resist pattern on the storage capacitor contact region 153 has a uniform thickness. The second photo-resist pattern on the n-type TFT contact region 151 has a uniform thickness, which is twice the thickness of the second photo-resist pattern on the storage capacitor contact region 153. Two ends of the second photo-resist pattern on the p-type TFT contact region 155 have the same thickness, which is the same as the thickness of the second photo-resist pattern on the storage capacitor contact region 153. A middle portion of the second photo-resist pattern on the p-type TFT contact region 155 between the two ends of the p-type TFT contact region 155 has twice the thickness of the second photo-resist pattern on each of the two ends of the p-type TFT contact region 155.

Ultraviolet radiation is provided to expose the second photo-resist pattern. After exposing, the second photo-resist pattern is developed again, thereby forming a third photo-resist pattern (as shown in FIG. 6, not labeled). Because the first photo-resist layer is half-tone photo-resist, the second photo-resist pattern on the storage capacitor contact region 153 is completely removed, and the second photo-resist pattern on the two ends of the p-type TFT contact region 155 is completely removed. Half of the second photo-resist pattern on the n-type TFT contact region 151 is removed, and half of the middle portion of the second photo-resist pattern on the p-type TFT contact region 155 between the two ends of the p-type TFT contact region 155 is removed. Using the third photo-resist pattern as a mask, the storage capacitor contact region 153 and the two ends of the p-type TFT contact region 155 are all heavily doped with the first dopant, e.g., boron ions.

Figure 7:
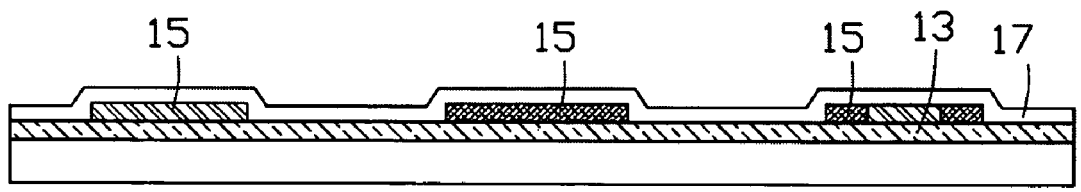

In step S4, referring to FIG. 7, the second photo-resist pattern remaining from step S3 is removed, and the gate insulator 17 is formed on the buffer layer 13 and the p-Si pattern 15.

Figure 8:
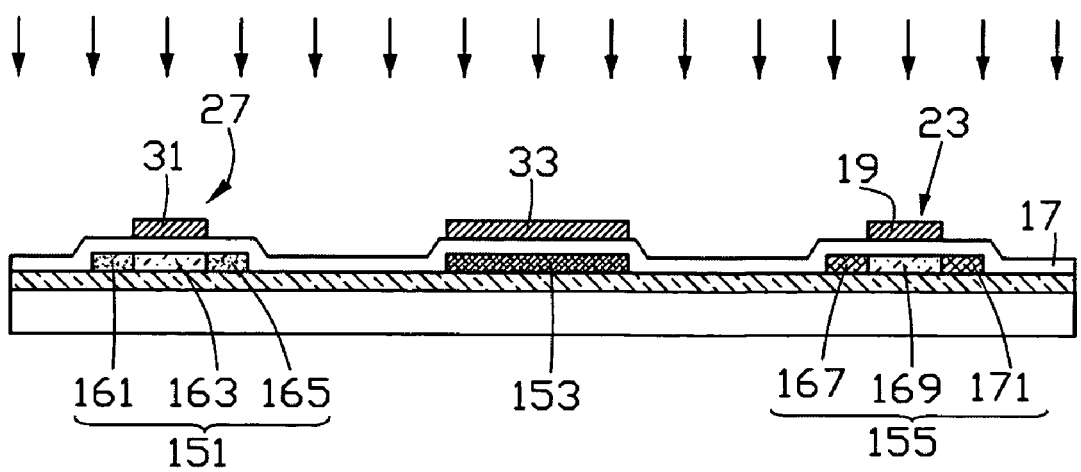

In step S5, referring to FIG. 8, a metal layer (not shown) is formed on the gate insulator 17 by CVD or PVD. A second photo-resist layer (not shown) is formed on the metal layer. A third photo-mask (not shown) and ultraviolet radiation (not shown) are provided to expose the second photo-resist layer. The exposed second photo-resist layer is developed, thereby forming a fourth photo-resist pattern. Using the fourth photo-resist pattern as a mask, the metal layer is etched, thereby forming three metal wires 31, 33, 19. The metal wire 31 corresponds to a middle portion of the n-type TFT contact region 151 between the two ends of the n-type TFT contact region 151, and is a gate electrode of an n-type TFT 27. The metal wire 33 corresponds to the storage capacitor contact region 153, and is a first electrode of a storage capacitor. The metal wire 19 corresponds to the middle portion of the p-type TFT contact region 155 between the two ends of the p-type TFT contact region 155, and is a gate electrode of a p-type TFT 23. The metal layer may be made of aluminum (Al), molybdenum (Mo), titanium (Ti), copper (Cu), chromium (Cr), tantalum (Ta), or any suitable combination thereof.

Using the metal wires 31, 33, 19 as a mask, the two ends of the n-type TFT contact region 151 and the two ends of the p-type TFT contact region 155 are all heavily doped with a second dopant such as phosphorus ions by self alignment. Thus, the two ends of the n-type TFT contact region 151 are formed into the source electrode contact region 161 and the drain electrode region 165. The middle portion between the two ends of the n-type TFT contact region 151 is formed into the channel 163. The two ends of the p-type TFT contact region 155 are formed into the source electrode contact region 167 and the drain electrode region 171. The middle portion between the two ends of the p-type TFT contact region 155 is formed into the channel 169. The molar ratio of the first dopant to the second dopant is approximately 2 to 1. The boron ions and the phosphorus ions are compensative. Though the two ends of the p-type TFT contact region 155 are also heavily doped with the second dopant at the same time, the source electrode contact region 167 and the drain electrode contact region 171 are still heavily doped with half of the first dopant beforehand.

Figure 9:
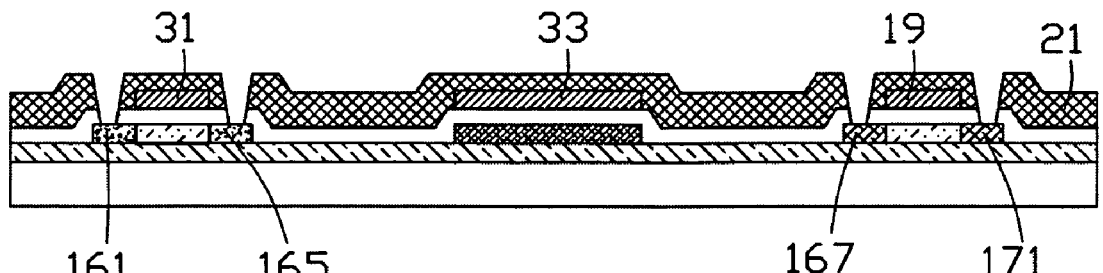

In step S6, referring to FIG. 9, the passivation layer 21 is formed covering the gate insulator 17 and the three metal wires 31, 33, 19. A third photo-resist layer (not shown) is formed on the passivation layer 21. A fourth photo-mask (not shown) and ultraviolet radiation (not shown) are provided to expose the third photo-resist layer. The exposed third photo-resist layer is then developed, thereby forming a fifth photo-resist pattern. Using the fifth photo-resist pattern as a mask, the passivation layer 21 is etched, thereby forming the four contact holes to expose the source electrode contact region 161, the drain electrode contact region 165, the source electrode contact region 167, and the drain electrode contact region 171, respectively.

Figure 10:
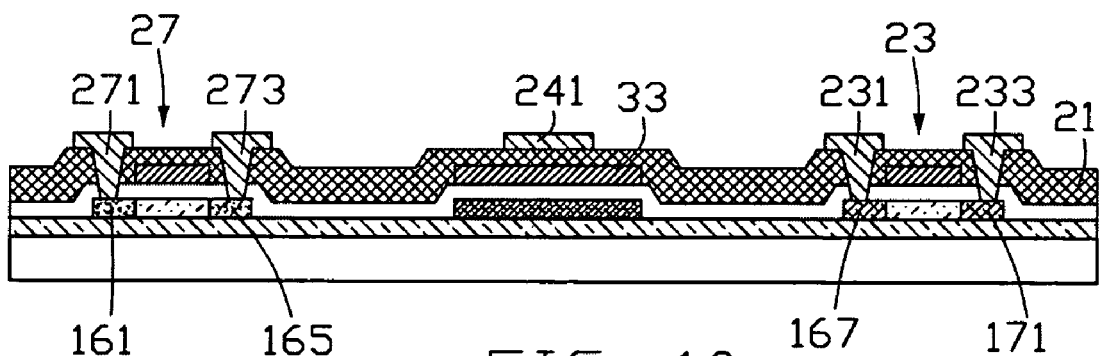

In step S7, referring to FIG. 10, an electrode metal layer (not shown) is formed on the passivation layer 21 and in the four contact holes. A fourth photo-resist layer (not shown) is formed on the electrode metal layer. A fifth photo-mask (not shown) and ultraviolet radiation (not shown) are provided to expose the fourth photo-resist layer. The exposed fourth photo-resist layer is then developed, thereby forming a sixth photo-resist pattern. Using the sixth photo-resist pattern as a mask, the electrode metal layer is etched, thereby forming the five electrodes 271, 273, 241, 231 and 233. The electrode 271 connected to the source electrode contact region 161 is a source electrode of the n-type TFT 27. The electrode 273 connected to the drain electrode contact region 165 is a drain electrode of the n-type TFT 27. The electrode 231 connected to the source electrode contact region 167 is a source electrode of the p-type TFT 23. The electrode 233 connected to the drain electrode contact region 167 is a drain electrode of the p-type TFT 23. The electrode 241 corresponding to the metal wire 33 is a second electrode of the storage capacitor.

Figure 11:
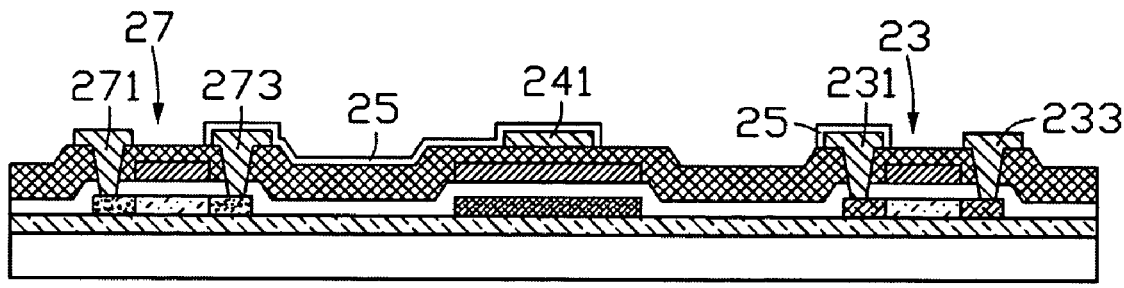

In step S8, referring to FIG. 11, a transparent conductive layer is formed on the passivation layer 21 and the electrodes 271, 273, 241, 231 and 233. A fifth photo-resist layer (not shown) is formed on the transparent conductive layer. A sixth photo-resist mask (not shown) and ultraviolet radiation (not shown) are provided to expose the fifth photo-resist layer. The exposed fifth photo-resist layer is then developed, thereby forming a seventh photo-resist pattern. Using the seventh photo-resist pattern as a mask, the transparent conductive layer is etched, thereby forming a pixel electrode 25 connected to the drain electrode 273 of the n-type TFT 27, the second electrode 241 of the storage capacitor, and the source electrode 233 of the p-type TFT 23. The storage capacitor contact region 153, the gate insulator 17, the first electrode 33, the passivation layer 21, and the second electrode 241 define the storage capacitor thereinto. The transparent conductive layer may be indium-tin oxide (ITO) or indium-zinc oxide (IZO). With these steps, the LTPS-TFT substrate 1 is obtained.

Compensative dopants are doped into the n-type TFT contact region 151 and the p-type TFT contact region 153 during fabrication of the n-type TFT 27 and the p-type TFT 23 of the LTPS-TFT substrate 1, with the result that a total of only six photo-masks is required. Accordingly, the process of fabricating the LTPS-TFT substrate 1 is simplified. Accordingly, the quality of the LTPS-TFT substrate 1 is apt to be improved, and the cost of fabricating the LTPS-TFT substrate 1 is lowered. Moreover, the finished top surface of the LTPS-TFT substrate 1 is relatively flat, due to the reduced number of photo-masks used in the fabrication process. For some applications, no planarization layer (not shown) is required to be added to the LTPS-TFT substrate 1, thereby providing the LTPS-TFT substrate 1 with a reduced thickness.

The disclosure is not limited to above-described embodiments. For example, in other embodiments, the two ends of the n-type TFT contact region 151 and the storage capacitor contact region 153 can be heavily doped with the second dopant (such as phosphorus ions) beforehand. Then the two ends of the p-type TFT contact region 153 and the two ends of the n-type TFT contact region 151 are all heavily doped with the first dopant (such as boron ions) by self alignment. The molar ratio of the first dopant to the second dopant is approximately 1 to 2. Because the boron ions and phosphorus ions are compensative, the source electrode contact region 161 and the drain electrode contact region 165 are still heavily doped with half of the second dopant once fabrication of the LTPS-TFT substrate 1 is completed. In another example, the buffer layer 13 can be omitted.

It is to be further understood that even though numerous characteristics and advantages of the present embodiments have been set out in the foregoing description, together with details of the structures and functions of the embodiments, the disclosure is illustrative only; and that changes may be made in detail, especially in matters of shape, size and arrangement of parts within the principles of the invention to the full extent indicated by the broad general meaning of the terms in which the appended claims are expressed.

What is claimed is:

1. A method for fabricating a low temperature poly-silicon (p-Si) thin film transistor (LTPS-TFT) substrate, the method comprising:

providing a substrate and forming a p-Si layer over the substrate;

forming a p-Si pattern, the p-Si pattern comprising a source electrode contact region and a drain electrode contact region of a first type TFT, and a source electrode contact region and a drain electrode contact region of a second type TFT;

heavily doping the source electrode contact region and the drain electrode contact region of the first type TFT with a first dopant;

forming a gate insulator on the p-Si pattern, and forming a gate electrode of the first type TFT and a gate electrode of the second type TFT on the gate insulator;

heavily doping the source electrode contact regions and drain electrode contact regions of the first and second type TFTs with a second dopant;

forming a passivation layer on the gate insulator and the gate electrodes of the first and second type TFTs;

forming a plurality of contact holes corresponding to the p-Si pattern; and forming a source electrode connected to the source electrode contact region having been doped with the first dopant and the second dopant of the first type TFT, and a drain electrode connected to the drain electrode contact region having been doped with the first dopant and the second dopant of the first type TFT, and a source electrode connected to the source electrode contact region having been doped with the second dopant of the second type TFT, and a drain electrode connected to the drain electrode contact region having been doped with the second dopant of the second type TFT, via the contact holes;

wherein the p-Si pattern further comprises a storage capacitor contact region, during heavy doping of the source electrode contact region and the drain electrode contact region of the first type TFT with a first dopant, the storage capacitor contact region is heavily doped with the first dopant synchronously; during formation of a gate electrode of the first type TFT and a gate electrode of the second type TFT on the gate insulator, a first electrode is formed on the gate insulator synchronously; during formation of a source electrode connected to the source electrode contact region of the first type TFT and a drain electrode connected to the drain electrode contact region of the first type TFT, and a source electrode connected to the source electrode contact region of the second type TFT and a drain electrode connected to the drain electrode contact region of the second type TFT via the contact holes, a second electrode is formed on the passivation layer synchronously; and the storage capacitor contact region, the gate insulator, the first electrode, the passivation layer, and the second electrode define a storage capacitor;

wherein the first dopant and the second dopant are compensative, and the molar ratio of the first dopant to the second dopant is approximately 2 to 1.

2. The method of claim 1, further comprising forming a buffer layer on the substrate before forming the p-Si layer, wherein an amorphous silicon (a-Si) layer is formed on the buffer layer, and the a-Si layer is melted and then crystallizes into the p-Si layer through excimer laser annealing (ELA).

3. The method of claim 2, wherein the p-Si pattern further comprises a channel formed between the source electrode contact region and the drain electrode contact region of the first type TFT, and a channel formed between the source electrode contact region and the drain electrode contact region of the second type TFT.

4. The method of claim 3, wherein the first type TFT is a p-type TFT and the second type TFT is an n-type TFT.

5. The method of claim 4, wherein the first dopant is boron ions, and the second dopant is phosphorus ions.

6. The method of claim 3, wherein the first type TFT is an n-type TFT, and the second type TFT is a p-type TFT.

7. The method of claim 6, wherein the first dopant is phosphorus ions, and the second dopant is boron ions.

8. The method of claim 1, wherein the gate electrodes are made of material selected from the group consisting of aluminum (Al), molybdenum (Mo), titanium (Ti), copper (Cu), chromium (Cr), tantalum (Ta), and any combination thereof.

9. A method for fabricating a low temperature poly-silicon (p-Si) thin film transistor (LTPS-TFT) substrate, the method comprising:

providing a substrate, and forming a p-Si layer over the substrate;

forming a p-Si pattern, the p-Si pattern comprising a source electrode contact region and a drain electrode contact region of a first type TFT, a storage capacitor contact region, and a source electrode contact region and a drain electrode contact region of a second type TFT;

heavily doping the storage capacitor contact region, the source electrode contact region and the drain electrode contact region of the first type TFT with a first dopant;

forming a gate insulator on the p-Si pattern, and forming a first electrode of the storage capacitor, a gate electrode of the first type TFT and a gate electrode of the second type TFT on the gate insulator;

heavily doping the source electrode contact regions and drain electrode contact regions of the first and second type TFTs with a second dopant;

forming a passivation layer on the gate insulator, the first electrode of the storage capacitor and the gate electrodes of the first and the second type TFTs;

forming a plurality of contact holes corresponding to the p-Si pattern; and forming a second electrode of the storage capacitor, and forming a source electrode connected to the source electrode contact region of the first type TFT and a drain electrode connected to the drain electrode contact region of the first type TFT, and a source electrode connected to the source electrode contact region of the second type TFT and a drain electrode connected to the drain electrode contact region of the second type TFT, via the contact holes;

wherein the first dopant and the second dopant are compensative, and the molar ratio of the first dopant to the second dopant is approximately 2 to 1.

10. The method of claim 9, further comprising a buffer layer formed on the substrate before formation of the p-Si layer, wherein an amorphous silicon (a-Si) layer is formed on the buffer layer, and the a-Si layer is melted and then crystallizes into the p-Si layer by excimer laser annealing (ELA).

11. The method of claim 10, wherein the p-Si pattern further comprises a channel formed between the source electrode contact region and the drain electrode contact region of the first type TFT, and a channel formed between the source electrode contact region and the drain electrode contact region of the second type TFT.

12. The method of claim 11, wherein the first type TFT is a p-type TFT, and the second type TFT is an n-type TFT.

13. The method of claim 12, wherein the first dopant is boron ions, and the second dopant is phosphorus ions.

14. The method of claim 11, wherein the first type TFT is an n-type TFT, and the second type TFT is a p-type TFT.

15. The method of claim 14, wherein the first dopant is phosphorus ions, and the second dopant is boron ions.

16. The method of claim 9, wherein the gate electrodes are made of material selected from the group consisting of aluminum (Al), molybdenum (Mo), titanium (Ti), copper (Cu), chromium (Cr), tantalum (Ta), and any combination thereof.

* * * * *